US007456462B1

(12) United States Patent
Heshami et al.

(10) Patent No.: US 7,456,462 B1
(45) Date of Patent: Nov. 25, 2008

(54) FABRICATED U-SHAPED CAPACITOR FOR A DIGITAL-TO-ANALOG CONVERTER

(75) Inventors: Mehrdad Heshami, Palo Alto, CA (US); Mansour Keramat, San Jose, CA (US)

(73) Assignee: Alvand Technologies, Inc., Santa Clara, CA (US)

( * ) Notice: Subject to any disclaimer, the term of this patent is extended or adjusted under 35 U.S.C. 154(b) by 189 days.

(21) Appl. No.: 11/371,145

(22) Filed: Mar. 7, 2006

(51) Int. Cl.
*H01L 29/94* (2006.01)
(52) U.S. Cl. .................. 257/307; 257/296; 257/298; 257/306; 257/308; 257/E21.648; 341/150
(58) Field of Classification Search .............. 257/303, 257/306, 307, 296, 298, 300, 308, E21.648; 341/150
See application file for complete search history.

(56) References Cited

U.S. PATENT DOCUMENTS 6,690,570 B2 * 2/2004 Hajimiri et al. .......... 361/306.1
6,743,671 B2   6/2004 Hu
2006/0261394 A1  11/2006 Chien

\* cited by examiner

*Primary Examiner*—Evan Pert
*Assistant Examiner*—Tan N Tran
(74) *Attorney, Agent, or Firm*—Stattler-Suh PC (57) ABSTRACT

A layered capacitor having top and bottom plates formed from multiple layers. The capacitor has a bottom layer comprising a bottom plate portion and at least one upper layer, each upper layer comprising top and bottom plate portions. A first set of vias connect the bottom plate portions and a second set of vias connect the top plate portions. The bottom plate portions and the first set of vias comprise a U-shaped bottom plate and the top plate portions and the second set of vias comprise a top plate of the capacitor device. The layers may comprise metal layers produced using semiconductor fabrication methods. Also provided is a capacitor array having two or more capacitors where connectors connect all top plate portions of the capacitors. The capacitor array may be used in a capacitive DAC, which may be used in a SAR ADC.

12 Claims, 7 Drawing Sheets

FABRICATED U-SHAPED CAPACITOR FOR A DIGITAL-TO-ANALOG CONVERTER

FIELD OF THE INVENTION

The invention is directed towards a fabricated U-shaped capacitor for a digital-to-analog converter.

BACKGROUND OF THE INVENTION

A digital-to-analog converter (DAC) converts digital code into an analog signal and has a multitude of applications (e.g., in audio, video, signal processing, etc.). To perform this conversion, DACs may implement various components, such as switches, resistors, current sources, or capacitors. In particular, a capacitive DAC uses a bank of capacitors (comprising a plurality of capacitors having various capacitance values) and typically requires lower power as compared to other types of DACs. A capacitive DAC is a particularly useful component in mixed signal circuits.

However, for a capacitive DAC to achieve sufficient accuracy, large capacitors must typically be used in the capacitor bank. As known in the art, this is due to the use of capacitance value ratios in the conversion process that require good capacitor matching and ratio accuracy which is improved by larger capacitance values. However, the use of large capacitors results in increased chip area, lower processing speed, and reduced power benefit of the capacitive DAC. Also, use of large capacitors makes it difficult to achieve high ratio accuracy in the capacitor bank due to parasitic capacitances resulting from electric fields of capacitors dispersing to neighboring components.

As such, there is a need for a capacitor bank having small size, low-capacitance values with high precision and accuracy, good capacitor matching, and good shielding with low parasitic capacitances for use in a capacitive DAC.

SUMMARY OF THE INVENTION

Some embodiments of the invention provide a fabricated U-shaped capacitor having top and bottom plates formed from multiple layers. The capacitor includes a bottom layer comprising a bottom plate portion (the bottom plate portion comprising the entirety of the bottom layer) and at least one upper layer, each upper layer comprising a bottom plate portion and a top plate portion. A first set of vias connect the bottom plate portions of the layers and a second set of vias connect the top plate portions of the upper layers. The bottom plate portions and the first set of vias comprise a U-shaped bottom plate of the capacitor device and the top plate portions and the second set of vias comprise a top plate of the capacitor device, the top plate being surrounded by the bottom plate of the capacitor device. In some embodiments, the top plate extends past the length of the bottom plate. In some embodiments, the layers comprise metal layers and the U-shaped capacitor is produced using semiconductor fabrication methods used for producing integrated circuits.

Some embodiments of the invention provide a capacitor array having two or more fabricated U-shaped capacitors arranged in columns and rows, where all top plate portions of U-shaped capacitors of a same column are connected to form a unified top plate. The array also includes a set of connectors connecting the unified top plates of the columns of the array so that all top plate portions of the U-shaped capacitors in the array are coupled. In some embodiments, the capacitor array is used in a capacitive DAC. The bottom plates of the capacitors in the array are connected according to the architecture of the DAC (e.g., binary weighted, segmented, etc.). In some embodiments, the capacitive DAC is used in a successive approximation analog-to-digital converter (SAR ADC).

The capacitor and capacitor array of some embodiments provide high accuracy at a small capacitor size and low capacitor values which allow creation of high-density, high-accuracy and high-speed DACs and SAR ADCs.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Capacitive DAC

As known in the art, a capacitor is a device for storing an electric charge and is comprised of two plates (top and bottom plates) made of an electrically conducting material (such as metal) and separated by a nonconducting material or air. A voltage is applied to the plates and one plate becomes positively charged and the other negatively charged. As electric charge accumulates on the plates, an electric field is produced between the plates. If the applied voltage is removed, the plates of the capacitor remain charged and the presence of the electric field between the plates remains until it is discharged. The value of a capacitor's capacitance reflects the amount of charge stored on the plates and is expressed in farads. The capacitance is proportional to the surface area of the plates and inversely proportional to the distance between the plates. As such, capacitance can be increased by increasing the area of the plates.

Figure 1:
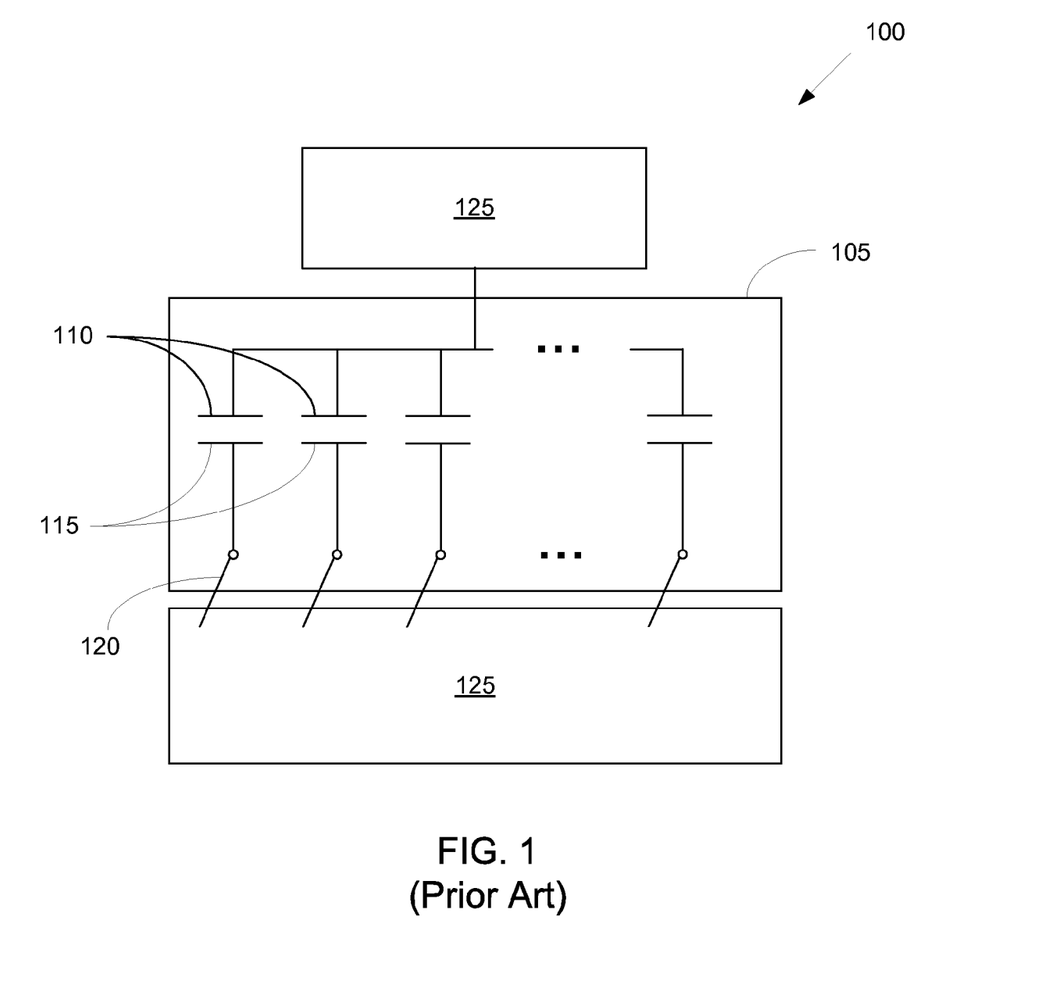
FIG. 1 is a block diagram of a generic capacitive DAC.

A capacitive DAC uses a bank of capacitors (comprising a plurality of capacitors having various capacitance values) and ratios of the capacitance values to convert a received digital code into an analog signal. FIG. 1 is a block diagram of a generic capacitive DAC 100 comprising a bank of capacitors 105 and various processing circuits 125. Each capacitor in the bank 105 has a top plate 110 and a bottom plate 115. As shown in FIG. 1, all top plates 110 of the capacitors are coupled to each other and also coupled to one or more processing circuits 125 of the DAC. Each bottom plate 115 is typically connect to a switch 120 that couples and decouples the bottom plate of the capacitor to various processing circuits 125 of the DAC.

The bottom plates 115 are coupled to the various processing circuits 125 according to the architecture of the DAC (e.g., binary weighted, segmented, etc.). The bank of capacitors 105 are used in conjunction with the various processing circuits 125 to convert the received digital code into the analog signal. The processing circuits 125 of the DAC are well known in the art and not discussed in detail here.

Examples of DAC architectures known in the art include pulse width modulator, oversampling (e.g., delta-sigma DAC), binary weighted, segmented, hybrid, etc. Regardless of the architecture type of a DAC, the resolution of a DAC is the number of possible output levels the DAC is configured to reproduce. DAC resolution is typically stated as the number of bits it uses (the bits going from a least significant bit (LSB) to a most significant bit (MSB)). In a binary weighted architecture, if a capacitor with capacitance A is used for the LSB, a capacitor with capacitance $2*A$ is used for the $2^{nd}$ LSB, a capacitor with capacitance $2*2*A$ is used for the $3^{rd}$ LSB, and so forth. In a segmented architecture, an equal capacitor segment is used for each possible value of the DAC output. For example, an 8-bit segmented DAC would have 256 segments and a 16 bit segmented DAC would have 65536 segments.

II. SAR ADC

Figure 2:
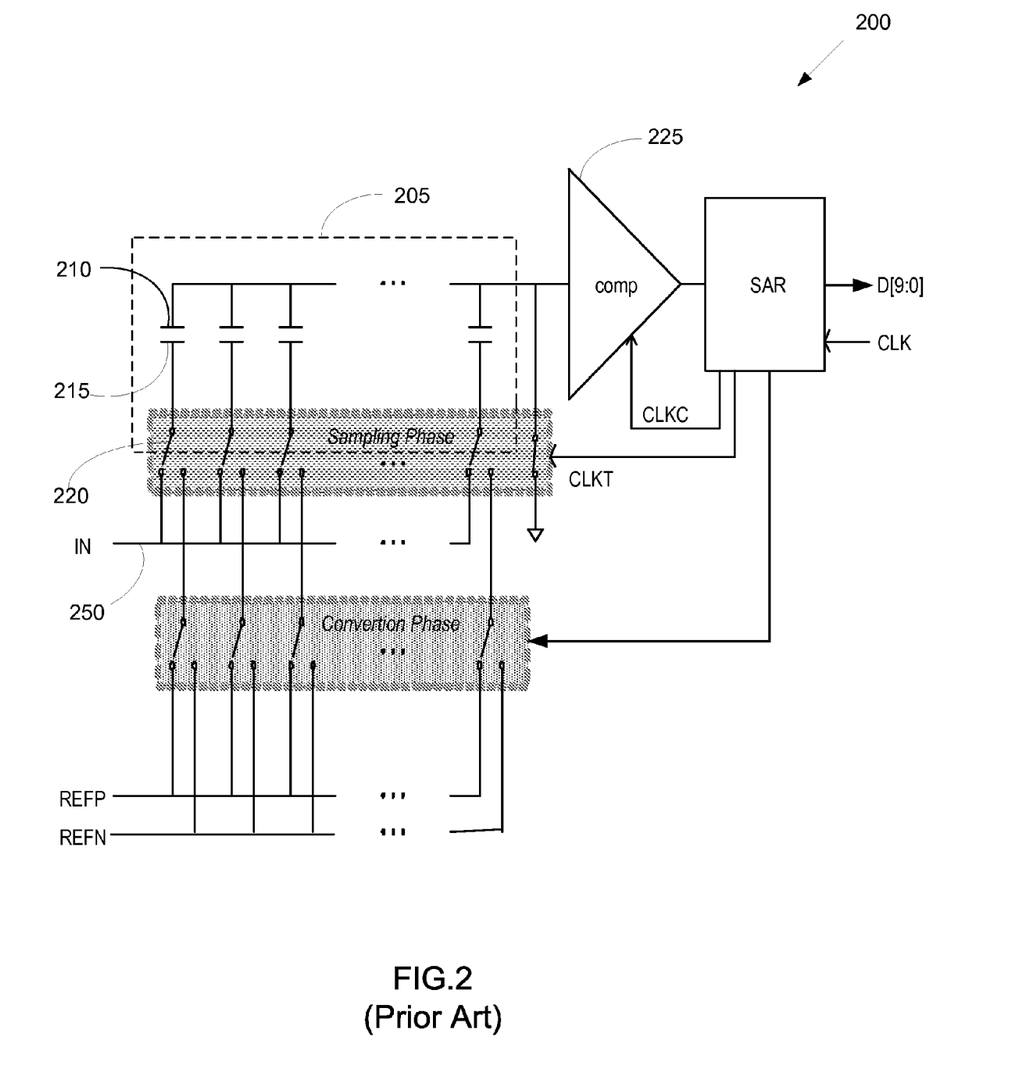
FIG. 2 is block diagram of a SAR ADC that uses a capacitive DAC.

A capacitive DAC is particularly useful in some analog-to-digital converters (ADCs), for example, a successive approximation analog-to-digital converter (SAR ADC). An ADC device converts a received analog signal into digital code output. FIG. 2 is block diagram of a SAR ADC 200 that uses a capacitive DAC. The SAR ADC 200 comprises a bank of capacitors 205 and various processing circuits. SAR ADCs are well known in the art and only a brief description of the components and operation of the SAR ADC is given here.

As shown in FIG. 2, all top plates 210 of the capacitors of the bank 205 are coupled to each other and also coupled to one or more processing circuits of the SAR ADC. Each bottom plate 215 is connected to a switch 220 that couples and decouples the bottom plate 215 of the capacitor to various processing circuits of the SAR ADC. The bottom plates 215 are coupled to the various processing circuits according to the architecture of the capacitive DAC (e.g., binary weighted, segmented, etc.) used in the SAR ADC.

During a sample phase, the SAR ADC 200 receives an analog signal (IN signal 250) and the switches 220 couple the bottom plates 215 of the capacitors to sample phase circuits of the SAR ADC to load the received signal across the capacitors in the bank 205. The SAR ADC 200 uses capacitance value ratios of the capacitors in the bank 205 and a comparator 225 to reject ranges of voltages of the received signal using successive approximation to set a final voltage range determination for the received signal. For example, in bit-weighting conversion (used in binary weighted architectures) the first comparison sets the MSB of the digital output, the second comparison sets the $2^{nd}$ MSB, the third comparison sets the $3^{rd}$ MSB, and so forth until the LSB of the digital output is set. During a conversion phase after the sample phase, the switches 220 are switched to couple the bottom plates 215 of the capacitors to the conversion phase circuits of the SAR ADC.

In a binary weighted architecture, the capacitor used for setting the MSB is shown as the farthest left capacitor in the bank 205, the capacitor used for setting the $2^{nd}$ MSB is shown as the $2^{nd}$ farthest left capacitor, and so forth, where the capacitor used for setting the LSB is shown as the farthest right capacitor in the bank. As discussed above, if a capacitor with capacitance A is used for the LSB, a capacitor with capacitance $2*A$ is used for the $2^{nd}$ LSB, a capacitor with capacitance $2*2*A$ is used for the $3^{rd}$ LSB, and so forth. As such, for a binary weighted DAC having 8 bit resolution, assuming that the capacitor used for setting the LSB has a capacitance value of 1 unit, the capacitance values of the capacitors in the bank 205 from left to right would be 128, 64, 32, 16, 8, 4, 2, and 1 units.

As discussed above, for a capacitive DAC to achieve sufficient accuracy, large capacitors must typically be used in the capacitor bank. However, the use of large capacitors results in increased chip area, lower processing speed, reduced power benefit, and parasitic capacitances.

III. Fabricated U-Shaped Capacitor

Figure 3:
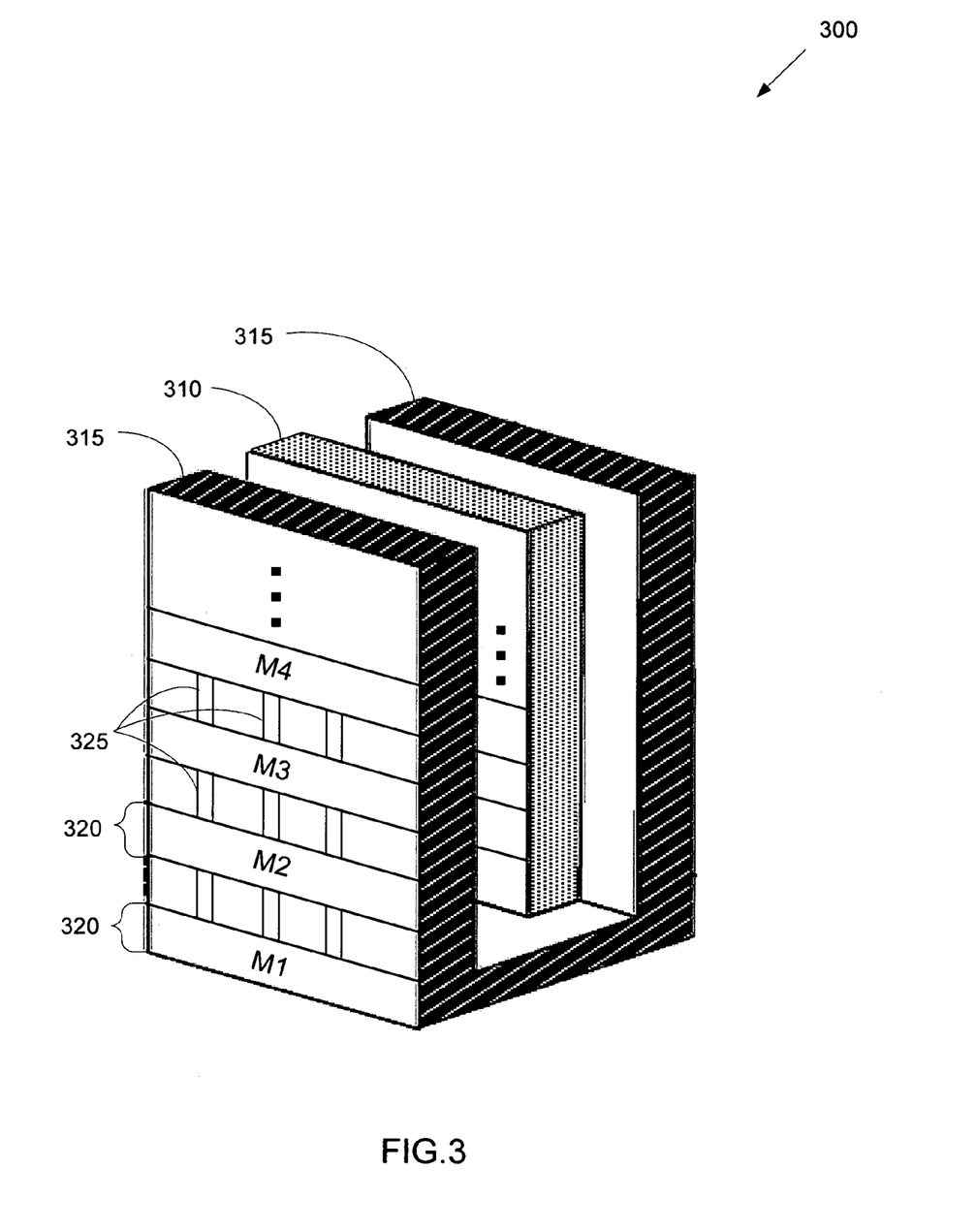
FIG. 3 shows a conceptual diagram of a fabricated U-shaped capacitor formed from a plurality of layers.

A fabricated U-shaped capacitor is provided herein to provide small size, low-capacitance values with high precision and accuracy, good capacitor matching, and good shielding with low parasitic capacitances that can be used, for example, in a capacitive DAC. FIG. 3 shows a conceptual diagram of a fabricated U-shaped capacitor 300 comprising a top plate 310 and a bottom plate 315 formed from a plurality of layers 320 and vias 325. In some embodiments, the U-shaped capacitor 300 is made of five layers, but in other embodiments, the U-shaped capacitor 300 is comprised of a different number of layers. As used herein, a "top layer" refers to the uppermost layer, a "bottom layer" refers to the lowest layer, an "upper layer" refers to any layer that is not the bottom layer, and a "lower layer" refers to any layer that is not the top layer of the U-shaped capacitor.

The U-shaped capacitor 300 has a bottom layer that comprises a bottom plate portion 315, the bottom plate portion 315 comprising the entirety of the bottom layer. The U-shaped capacitor 300 also has one or more upper layers, each upper layer comprising a bottom plate portion and a top plate portion, the bottom and top plate portions being separated by a distance. The top plate portion is between two separate bottom plate portions. A first set of one or more vias connect the bottom plate portions of the bottom layer and the upper layers and a different second set of one or more vias connect the top plate portions of the upper layers.

The bottom plate portions and the first set of vias 325 comprise the bottom plate 315 of the capacitor 300 and the top plate portions and the second set of vias 325 comprise the top plate 310 of the capacitor 300. None of the bottom plate portions or first set of vias are coupled to any of the top plate portions or second set of vias so that the bottom and top plates are not coupled. As shown in FIG. 3, the bottom plate portions and the first set of vias 325 form a U-shaped bottom plate 315. The top plate 310 is surrounded by U-shaped bottom plate 315 but does not contact the bottom plate, the top and bottom plates being separated by a distance.

Figure 4:
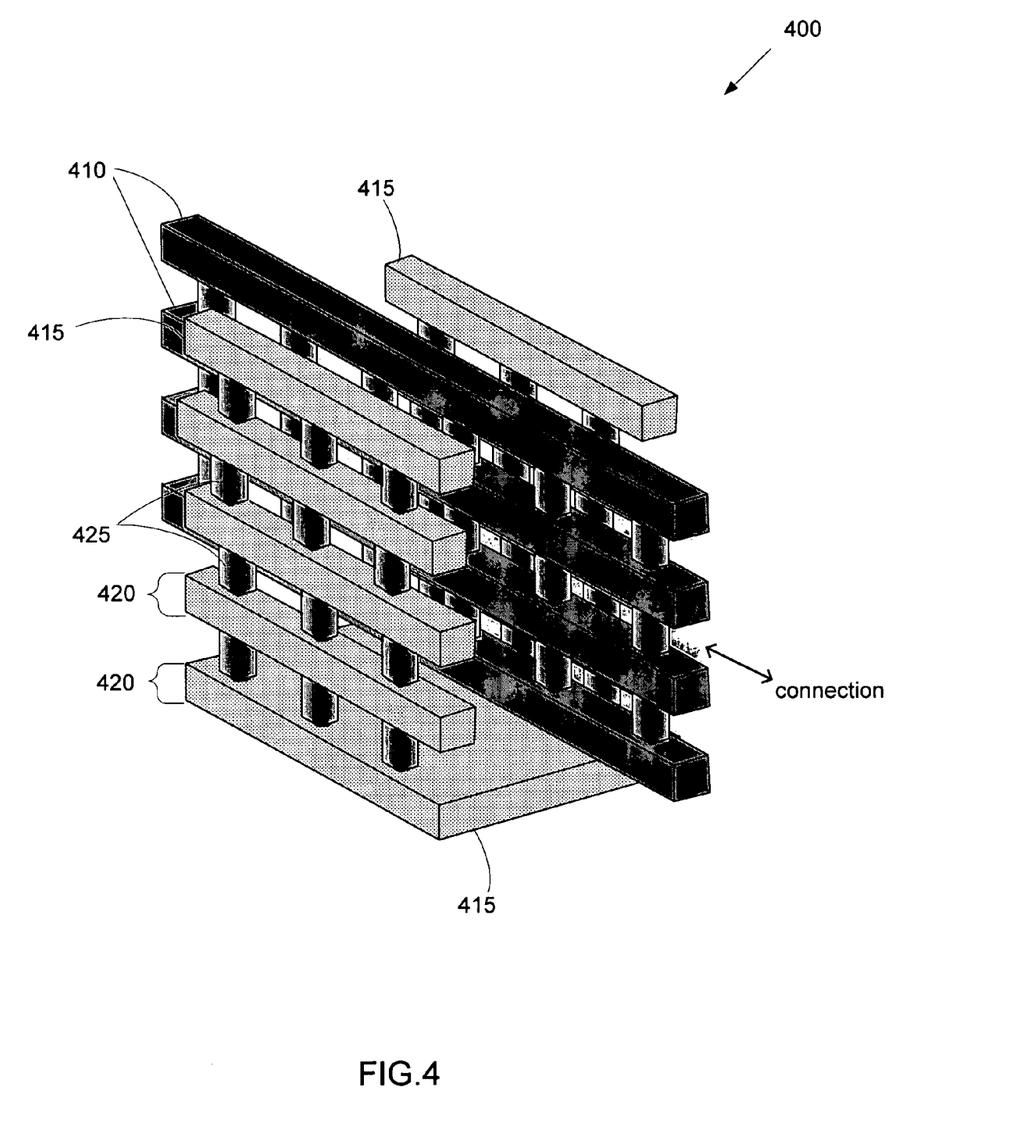
FIG. 4 shows a three dimensional diagram of a fabricated U-shaped capacitor formed from five layers.

FIG. 4 shows a three dimensional diagram of a fabricated U-shaped capacitor 400 comprising a top plate 410 and a bottom plate 415 formed from a plurality of layers 420 and vias 425. As shown in FIG. 4, the U-shaped capacitor 400 is comprised of five layers 420, although in other embodiments, a different number of layers is used. In some embodiments, the length of the top plate extends past the length of the bottom plate (as shown in FIG. 4) to allow easy coupling/connection of the top plate to a connector from the outside or to another top plate of another capacitor from the outside.

Figure 5:
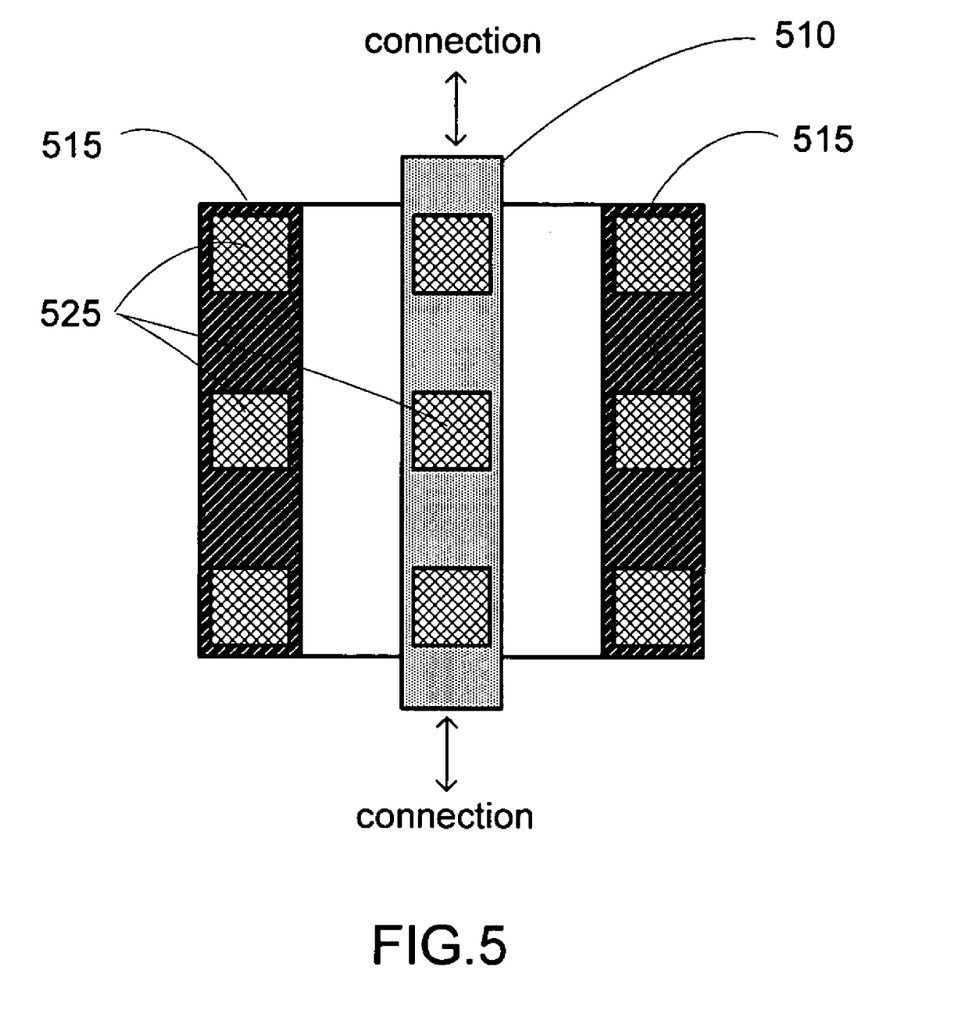
FIG. 5 shows a top view of the U-shaped capacitor of FIG. 4.

FIG. 5 shows a top view of the U-shaped capacitor 400 of FIG. 4. The top view shows a portion of a top plate 510 and a portion of a bottom plate 515 separated by a distance. The top plate portion of an upper layer is connected to top plate portions of other layer by vias 525 and the bottom plate portion of a layer is connected to bottom plate portions of other layer by vias 525. As shown in FIG. 5, an upper layer of the capacitor comprises a bottom plate portion 515 comprising two separate structures being unconnected across the top layer and a top plate portion 510, being between the two separate structures. In some embodiments, the length of the top plate extends past the length of the bottom plate (as shown in FIG. 5) to allow easy coupling/connection of the top plate to a connector from the outside or to another top plate of another capacitor from the outside.

In some embodiments, the layers of the U-shaped capacitor are comprised of metal layers (e.g., M1, M2, M3, etc.), the metal layers being formed, for example, from any metal oxide or alloy, single element compounds or compositions of multiple metals, etc. In some embodiments, the U-shaped capacitor is formed using semiconductor fabrication methods, for example, as conventionally used for producing integrated circuits. For example, the capacitor may be formed on a substrate of any material suitable for a capacitor (e.g., GaAs, silicon, germanium, etc.) where the bottom metal layer is formed on the substrate and upper layers are deposited one by one on top of the bottom metal layer. The capacitor may be formed by any deposition technique (e.g., chemical or physical vapor deposition, etc.). Methods of semiconductor fabrication are well known in the art and not discussed in detail here.

The U-shaped capacitor can be used in a capacitor bank of a capacitive DAC where it is used and connected similar to a conventional capacitor in the bank. In some embodiments, the U-shaped capacitor comprises a single unit capacitor having a particular capacitance value A that is used for the LSB of a capacitive DAC.

IV. Capacitor Array

Figure 6:
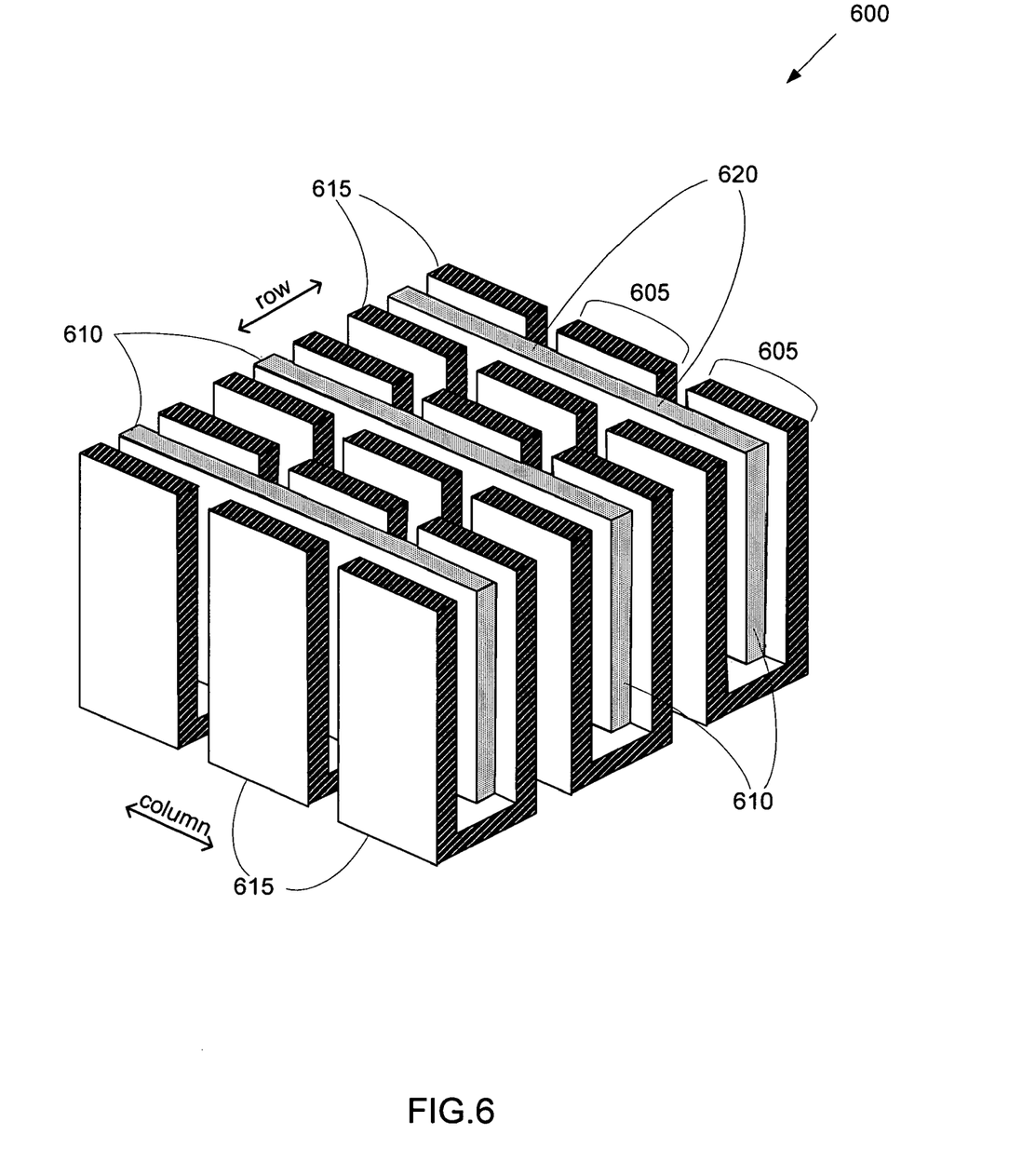
FIG. 6 shows a three dimensional diagram of a capacitor array comprising two or more U-shaped capacitors.

In some embodiments, a capacitor array is provided comprising two or more U-shaped capacitors. In some embodiments, the two or more U-shaped capacitors have approximately equal capacitance values. FIG. 6 shows a three dimensional view of a capacitor array 600 comprising two or more U-shaped capacitors 605 arranged in a predetermined number of columns and rows. FIG. 6 shows an example of a 3×3 array, but in other embodiments, arrays of other dimensions are used.

Each U-shaped capacitor 605 has a top plate 610 and a bottom plate 615. The top plates 610 of the U-shaped capacitors 605 of a same column are coupled/connected to each together with a set of connectors 620 between the U-shaped capacitors 605. In other embodiments, the top plate 610 of each U-shaped capacitor 605 extends past the length of the bottom plate 615 of the U-shaped capacitor 605 and couples/connects to the top plate 610 of an adjacent U-shaped capacitor 605 in the same column. In these embodiments, the top plates 610 of the U-shaped capacitors 605 of a same column can be viewed as a single unified top plate 610 that extends through each of the U-shaped capacitors of the column.

Figure 7:
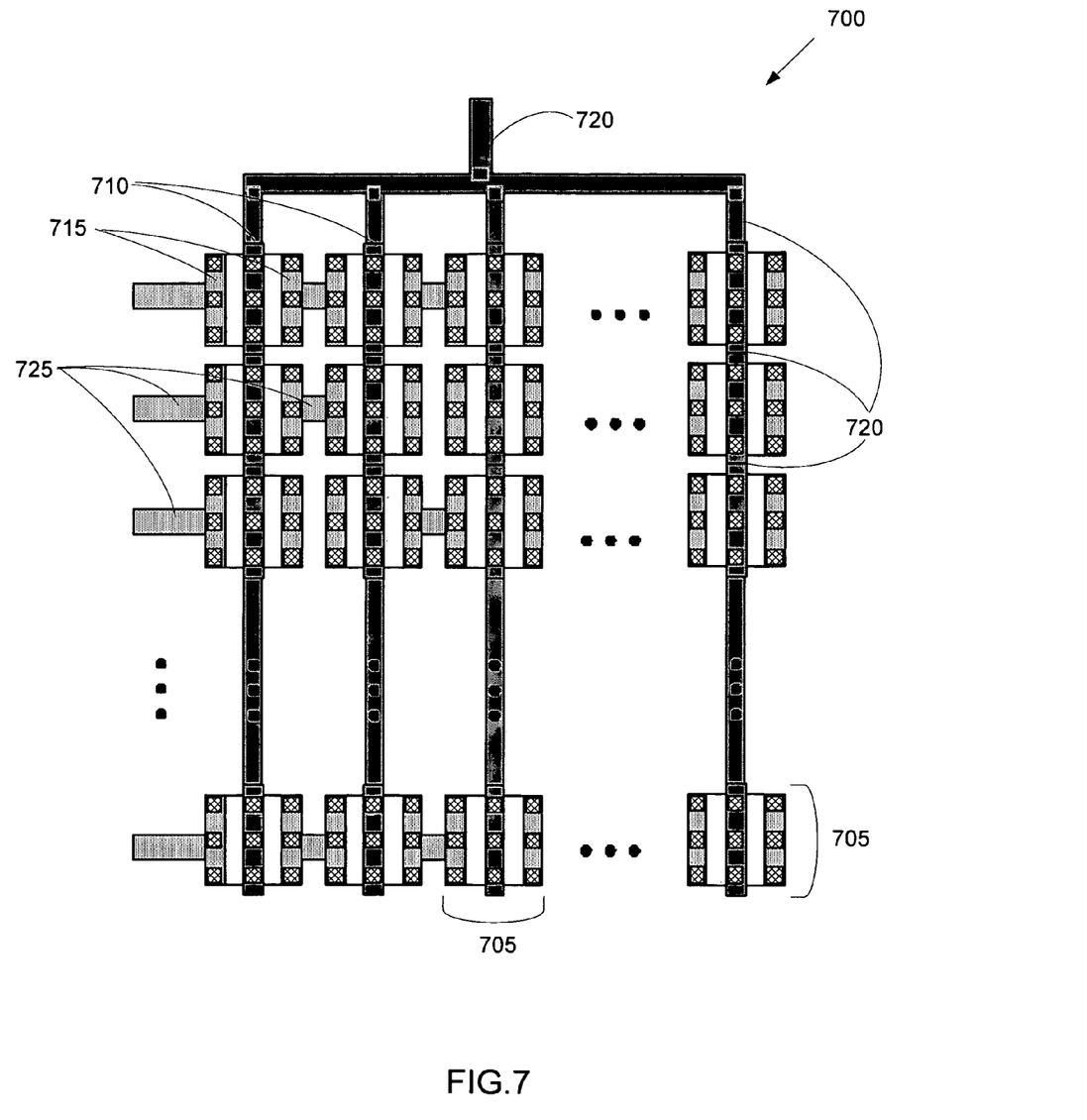
FIG. 7 shows a top view of a two dimensional capacitor array comprising two or more U-shaped capacitors.

FIG. 7 shows a top view of a two dimensional capacitor array 700 comprising two or more U-shaped capacitors 705 arranged in a predetermined number of columns and rows. In some embodiments, the number of columns is equal to the number of rows to create a square array. Top plates 710 of all U-shaped capacitors 705 in the array 700 are coupled/connected to each together with a set of connectors 720. In some embodiments, connectors 720 are used to couple top plates 710 of U-shaped capacitor 705 of the same column. In other embodiments, the top plate 710 of each U-shaped capacitor 705 extends past the length of the bottom plate 715 and couples/connects to the top plate 710 of an adjacent U-shaped capacitor 705 in the same column. In these embodiments, the top plates 710 of the U-shaped capacitors 705 of a same column can be viewed as a single unified top plate 710 that extends through each of the U-shaped capacitors of the column. The unified top plates 710 of the columns of the array 700 are then coupled to each other by connectors 720.

Bottom plates 715 of the U-shaped capacitors 705 can be coupled/connected to together with connectors 725 to create combined capacitors of two or more U-shaped capacitors 705. Since capacitance is proportional to the surface area of the plates, capacitance can be increased by increasing the area of the plates. As such, by connecting the bottom plates of two or more U-shaped capacitors 705, capacitance can be increased. For example, if each of three U-shaped capacitors has a capacitance of 1 fF, a capacitance of 3 fF can be created by connecting the bottom plates of the three U-shaped capacitors. In some embodiments, the capacitor array is used in a capacitive DAC and comprises the capacitor bank of the capacitive DAC. In these embodiments, the top plate of all U-shaped capacitors are connected to each other and the bottom plates of the U-shaped capacitors are connected according to the DAC architecture. In some embodiments, the bottom plates are connected in a way to produce a binary weighted or segmented DAC. In some embodiments, the capacitor array is used in a capacitive DAC that is used in a SAR ADC.

For a binary weighted DAC, if a U-shaped capacitor is considered a single unit capacitor and is used for the LSB of the DAC, two units are connected to each other and used for the $2^{nd}$ LSB, four units are connected to each other and used for the $3^{rd}$ LSB, and so forth. Thus, for a binary weighted DAC having 10 bit resolution, the capacitors in the capacitor bank 105 and 205 from left to right would comprise 512 connected units (for the MSB), 256 connected units, 128 connected units, 64 connected units, 32 connected units, 16 connected units, 8 connected units, 4 connected units, 2 connected units, and 1 unit. Each set of connected units (e.g., 256 units) comprise a single capacitor in the bank 105 and 205 and is connected to the other processing circuits of the DAC according to the architecture of the DAC.

The size of the capacitor array is determined by the size of the single unit capacitor, which in turn is determined by how small the capacitor for the LSB can be while still maintaining accurate capacitance ratios between all capacitors. The size of the capacitor array is also determined by the resolution of the DAC which determines the number of unit capacitors needed in the array. For example, for a DAC with 10 bit resolution, 1023 total units are needed in the array which, for example, can be arranged as a 32×32 unit array providing 1024 units. In some embodiments, the unit capacitors are arranged in a two dimensional array having a predetermined number of columns and rows, the predetermined number of columns and rows being dependent on the resolution of the DAC. In some embodiments, the number of columns is equal to the number of rows to create a square array. In these embodiments, the number of columns and the number of rows is determined by the equation: $2^{\wedge}(N/2)$, where N equals the DAC resolution expressed in bits.

For a segmented DAC, the array of unit capacitors are connected according to a segmented architecture, which typically includes a digital decoder. The array of unit capacitors may be connected according to a segmented architecture using methods well known in the art which are not discussed in detail here.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A capacitor device array comprising:
   at least two capacitor devices arranged in columns and rows,
   wherein each capacitor device is formed from a bottom layer and a plurality of upper layers above the bottom layer, each capacitor device comprising:
      a U-shaped bottom plate comprising a plurality of bottom plate portions; and
      a top plate comprising a plurality of top plate portions, wherein:
         the entirety of the bottom layer comprises a bottom plate portion of the U-shaped bottom plate;
         each upper layer comprises a top plate portion located between two separate bottom plate portions, the two separate bottom plate portions being unconnected across the upper layer; the U-shaped bottom plate comprises a bottom side formed from the bottom layer and right and left sides formed from the plurality of upper layers and a first set of vias, the right and left sides being connected to each other by the bottom side;
         the top plate is formed from the plurality of upper layers and a second set of vias, the top plate being surrounded by the U-shaped bottom plate on the bottom, right, and left sides of the top plate; and
         the top plate is not coupled to the U-shaped bottom plate, the top plate and U-shaped bottom plate being separated by a distance,
      wherein all top plates of capacitor devices of a same column of the array are connected to form a unified top plate; and
   a set of connectors connecting the unified top plates of different columns of the array.

2. The capacitor device array of claim 1, wherein:
   for each capacitor device in the array, the top plate extends past the length of the bottom plate to connect to a top plate of an adjacent capacitor device in the same column of the array.

3. The capacitor device array of claim 1, further comprising:
   a set of connectors connecting the top plates of capacitor devices of a same column of the array.

4. The capacitor device array of claim 1, wherein the capacitor device array is used in a capacitive digital-to-analog converter (DAC).

5. The capacitor device array of claim 4, wherein:
   the capacitive DAC has a resolution of a predetermined number of bits, from a least significant bit (LSB) to a most significant bit (MSB); and
   the capacitor devices are arranged in a two dimensional array having a predetermined number of columns and rows, the predetermined number of columns and rows being dependent on the resolution of the capacitive DAC.

6. The capacitor device array of claim 5, wherein the architecture of the DAC is a segmented architecture.

7. The capacitor device array of claim 5, wherein:
   the architecture of the DAC is a binary weighted architecture;
   the at least two capacitor devices have approximately equal capacitance values;
   a single capacitor device is coupled to the DAC for the LSB; and
   two capacitor devices are coupled to each other and coupled to the DAC for the next LSB.

8. A capacitive digital-to-analog converter (DAC) comprising:
   a capacitor device array comprising at least two capacitor devices arranged in columns and rows,
   wherein each capacitor device is formed from a bottom layer and a plurality of upper layers above the bottom layer, each capacitor device comprising:
      a U-shaped bottom plate comprising a plurality of bottom plate portions; and
      a top plate comprising a plurality of top plate portions, wherein:
         the entirety of the bottom layer comprises a bottom plate portion of the U-shaped bottom plate;
         each upper layer comprises a top plate portion located between two separate bottom plate portions, the two separate bottom plate portions being unconnected across the upper layer; the U-shaped bottom plate comprises a bottom side formed from the bottom layer and right and left sides formed from the plurality of upper layers and a first set of vias, the right and left sides being connected to each other by the bottom side;
      the top plate is formed from the plurality of upper layers and a second set of vias, the top plate being surrounded by the U-shaped bottom plate on the bottom, right, and left sides of the top plate; and
      the top plate is not coupled to the U-shaped bottom plate, the top plate and U-shaped bottom plate being separated by a distance,
      wherein all top plates of capacitor devices of a same column of the array are connected to form a unified top plate; and
   a set of connectors connecting the unified top plates of different columns of the array; and
   one or more processing circuits coupled to the capacitor device array for converting a digital code into an analog signal using the capacitor device array.

9. The capacitive DAC of claim 8, wherein:
   the capacitive DAC has a resolution of a predetermined number of bits, from a least significant bit (LSB) to a most significant bit (MSB); and
   the capacitor devices are arranged in a two dimensional array having a predetermined number of columns and rows, the predetermined number of columns and rows being dependent on the resolution of the capacitive DAC.

10. The capacitive DAC of claim 9, wherein the architecture of the DAC is a segmented architecture.

11. The capacitive DAC of claim 9, wherein:
    the architecture of the DAC is a binary weighted architecture;
    the at least two capacitor devices have approximately equal capacitance values;
    a single capacitor device is used for the LSB; and
    two capacitor devices are coupled to each other and used for the next LSB.

12. The capacitive DAC of claim 8, wherein the capacitive DAC is used in a successive approximation analog-to-digital converter (SAR ADC).

* * * * *